(12) United States Patent
Beppu et al.

(10) Patent No.: US 7,381,232 B2
(45) Date of Patent: Jun. 3, 2008

(54) PROCESS FOR PRODUCING CEO$_2$ FINE PARTICLES AND POLISHING SLURRY CONTAINING SUCH FINE PARTICLES

(75) Inventors: Yoshihisa Beppu, Yokohama (JP); Tomohiro Sakai, Yokohama (JP); Satoshi Kashiwabara, Yokohama (JP); Kazuo Sunahara, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 11/745,024

(22) Filed: May 7, 2007

(65) Prior Publication Data

US 2007/0204519 A1 Sep. 6, 2007

Related U.S. Application Data

(63) Continuation of application No. PCT/JP2005/020188, filed on Nov. 2, 2005.

(30) Foreign Application Priority Data

Nov. 8, 2004 (JP) ............................. 2004-323854

(51) Int. Cl.
*B24D 3/02* (2006.01)
*C09C 1/68* (2006.01)
*C09K 3/14* (2006.01)

(52) U.S. Cl. ................. 51/309; 423/263; 502/202; 502/304; 65/32.3; 501/10; 501/49; 75/343

(58) Field of Classification Search ............ 51/309; 423/263; 502/202, 304; 65/32.3; 501/10; 501/49; 75/343
See application file for complete search history.

(56) References Cited

U.S. PATENT DOCUMENTS 3,663,193 A * 5/1972 Wilson .................. 65/30.1

| 4,569,775 A | 2/1986 | Kubo et al. |
| 5,938,837 A | 8/1999 | Hanawa et al. |
| 5,951,724 A | 9/1999 | Hanawa et al. |
| 5,962,343 A | 10/1999 | Kasai et al. |
| 2002/0086618 A1 | 7/2002 | Ota et al. |
| 2003/0127959 A1* | 7/2003 | Nishikawa et al. ......... 313/143 |

FOREIGN PATENT DOCUMENTS

| JP | 56-169128 | 12/1981 |
| JP | 8-134435 | 5/1996 |
| JP | 10-94955 | 4/1998 |
| JP | 10-298537 | 11/1998 |
| JP | 2003-27045 | 1/2003 |
| JP | 2004-55861 | 2/2004 |

OTHER PUBLICATIONS

U.S. Appl. No. 11/745,024, filed May 7, 2007, Beppu et al.
U.S. Appl. No. 11/739,997, filed Apr. 25, 2007, Miyatani et al.

* cited by examiner

*Primary Examiner*—J. A. Lorengo
*Assistant Examiner*—Pegah Parvini
(74) *Attorney, Agent, or Firm*—Oblon, Spivak, McClelland, Maier & Neustadt, P.C.

(57) ABSTRACT

To provide a process for producing CeO$_2$ fine particles having high crystallinity, being excellent in uniformity of composition and particle size and having a small particle size, and a polishing slurry containing such fine particles.

A process for producing CeO$_2$ fine particles, which comprises a step of obtaining a melt containing, as represented by mol % based on oxides, from 5 to 50% of CeO$_2$, from 10 to 50% of RO (wherein R is at least one member selected from the group consisting of Mg, Ca, Sr and Ba) and from 30 to 75% of B$_2$O$_3$, a step of quenching the melt to obtain an amorphous material, a step of precipitating CeO$_2$ crystals from the amorphous material, and a step of separating the CeO$_2$ crystals from the obtained crystallized product, in this order. A polishing slurry containing from 0.1 to 20 mass % of such fine particles.

9 Claims, 1 Drawing Sheet

PROCESS FOR PRODUCING CEO₂ FINE PARTICLES AND POLISHING SLURRY CONTAINING SUCH FINE PARTICLES

TECHNICAL FIELD

The present invention relates to a process for producing $CeO_2$ fine particles and a polishing slurry containing such fine particles. Particularly, it relates to a process for easily obtaining $CeO_2$ fine particles having high crystallinity, being excellent in uniformity of composition and particle size, and having a small particle size, and a polishing slurry containing such fine particles.

BACKGROUND ART

Recently, particularly along with the increase in the integration and functionality of semiconductor integrated circuits, there has been a demand for development of microfabrication techniques for miniaturization and densification. Planarization techniques for interlayer insulating films and embedded wirings are important in semiconductor device production processes, in particular, in the process of forming multilayered wirings. That is, as the multilayered wirings are increasingly formed due to the miniaturization and densification in the semiconductor production processes, the degree of irregularities tends to increase in the surfaces of the individual layers, resulting in a situation where the step height exceeds the depth of focus in lithography. In order to prevent such a problem, high planarization techniques are important in the process of forming multilayered wirings.

As the material for such wirings, Cu has attracted attention because of its lower resistivity compared with conventionally used Al alloys and also because of its excellence in electromigration resistance. Since the vapor pressure of copper chloride gas is low, it is difficult to form Cu into the shape of wirings by Reactive Ion Etching (RIE) which has been conventionally used. Therefore, in order to form the wirings, a Damascene method is used. In this method, concave portions such as trench patterns and via holes for wirings, are formed in an insulating layer. A barrier layer is then formed thereon, and then Cu is deposited so as to be embedded in the trench portions to form a film by sputtering, plating or the like. Subsequently, the excess Cu and barrier layer are removed by Chemical Mechanical Polishing (hereinafter referred to as "CMP") until the surface of the insulating layer is exposed, other than the concave portions, whereby the surface is planarized to form an embedded metal wiring. Further, it is possible to form multilayered wirings comprising Cu and $SiO_2$ film by depositing an interlayer insulating film comprising $SiO_2$ on an embedded wiring, planarizing the $SiO_2$ film by CMP and forming the next embedded wiring. Recently, a Dual Damascene method has been predominantly used, in which Cu wirings and via holes embedded with Cu are simultaneously formed (e.g. Patent Document 1).

Further, in order to electrically separate devices such as transistors, shallow trench isolation (hereinafter referred to as STI) has been employed. In this method, a trench is formed on a silicon substrate while a device region is masked with a $SiN_x$ film, and then a $SiO_2$ film is deposited so that it is embedded in the trench, and then any $SiO_2$ film on the $SiN_x$ film is removed by CMP to electrically separate the device region. During CMP, it is common to use the $SiN_x$ film as a stopper by letting the removal rate of the $SiN_x$ film and the removal rate of the $SiO_2$ film have a selective ratio, so that polishing is terminated at the time when the $SiN_x$ film is exposed.

For such formation of Cu embedded wirings, for planarization of the interlayer insulating film, development of a polishing compound which provides a high removal rate of the $SiO_2$ film and a low removal rate of the $SiN_x$ film has been developed. Heretofore, as abrasive grains to be used for the above CMP, silica abrasive grains have been commonly used. However, they provide a low selective ratio between the removal rate of the $SiN_x$ film and the removal rate of the $SiO_2$ film, cerium oxide (hereinafter referred to as $CeO_2$) abrasive grains excellent in such selective ratio are becoming used instead.

For example, an attempt has been made to use a polishing compound in the form of a slurry containing ultrafine particles of high purity $CeO_2$ for the above process for producing a semiconductor device (e.g. Patent Document 2) However, since $CeO_2$ in a low crystalline state is chemically highly reactive, when a polishing compound slurry containing such $CeO_2$ ultrafine particles is used, problems such as a burned spot, orange peel and deposition on the polished surface tend to arise, and thus they cannot be used for precision polishing. In order to solve these problems, an attempt has been made is to use $CeO_2$ ultrafine particles obtained by mixing, with stirring, an aqueous solution of cerous nitrate with a base in such a mixing ratio that the pH value of the mixture ranges from 5 to 10, followed by aging at from 70 to 100° C. (Patent Document 3).

However, in this method, it is not easy to set the reaction conditions, and it is hard to control the end point of the reaction, and accordingly, it is difficult to control the particle size of the fine particles and the particle size distribution, and no sufficient properties were achieved for use as a precision polishing slurry in the process for producing a semiconductor device.

On the other hand, Patent Document 4 discloses a method for producing a magnetoplumbite type ferrite ($MFe_{12}O_{19}$) powder by glass crystallization method, comprising subjecting glass to heat treatment at a temperature of at least the glass transition point to precipitate ceramic crystals in the glass matrix, and dissolving and removing the glass with a weak acid to separate only precipitated crystals. This glass crystallization method is characterized in that it is effective as a means for preparing high purity ceramic particles and that the particle size, the particle size distribution and the shape of the particles are easily controlled, in a case where substances other than the crystallized particles are completely removed.

Patent Document 1: JP-A-2004-55861
Patent Document 2: JP-A-8-134435
Patent Document 3: U.S.P. 5,938,837
Patent Document 4: U.S.P. 4,569,775

DISCLOSURE OF THE INVENTION

Object to be Accomplished by the Invention

The present invention relates to a process for producing $CeO_2$ fine particles and a polishing slurry containing such fine particles, and the object is to provide a process to easily obtain $CeO_2$ fine particles which have a high crystallinity, which are excellent in uniformity of composition and particle size, which have a small particle size and which are suitable for precision polishing in a process for producing a semiconductor device, and a polishing slurry containing such fine particles.

Means to Accomplish the Object

The present invention provides the following.

(1) A process for producing $CeO_2$ fine particles, which comprises a step of obtaining a melt containing, as represented by mol % based on oxides, from 5 to 50% of $CeO_2$, from 10 to 50% of RO (wherein R is at least one member selected from the group consisting of Mg, Ca, Sr and Ba) and from 30 to 75% of $B_2O_3$, a step of quenching the melt to obtain an amorphous material, a step of precipitating $CeO_2$ crystals from the amorphous material, and a step of separating the $CeO_2$ crystals from the obtained crystallized product, in this order.

(2) The process for producing $CeO_2$ fine particles according to (1), wherein in the melt, the above $CeO_2$, the above RO and the above $B_2O_3$ are contained in a molar ratio of $CeO_2$:(RO+$B_2O_3$)=5:95 to 50:50.

(3) The process for producing $CeO_2$ fine particles according to (1) or (2), wherein in the melt, the above RO and the above $B_2O_3$ are contained in a molar ratio of RO:$B_2O_3$=20:80 to 50:50.

(4) The process for producing $CeO_2$ fine particles according to any one of (1) to (3), wherein the melt is quenched to obtain a flaky or fibrous amorphous material.

(5) The process for producing $CeO_2$ fine particles according to any one of (1) to (4), wherein the step of precipitating the $CeO_2$ crystals from the amorphous material is carried out at a temperature of from 600 to 900° C.

(6) The process for producing $CeO_2$ fine particles according to any one of (1) to (5), wherein the step of separating the $CeO_2$ crystals is carried out by using an acid.

(7) The process for producing $CeO_2$ fine particles according to any one of (1) to (6), wherein the average primary particle size of the $CeO_2$ fine particles is from 5 to 200 nm.

(8) A polishing slurry containing the $CeO_2$ fine particles obtained by the process as defined in any one of (1) to (7) dispersed in a liquid medium, with a content of from 0.1 to 20 mass % based on the slurry total mass.

(9) The polishing slurry according to (8), wherein the size of the dispersed particles is from 10 to 300 nm.

Effects of the Invention

According to the present invention, $CeO_2$ fine particles having high crystallinity, excellent in uniformity of composition and particle size, and having a small particle size, can easily be obtained. Thus, using such fine particles, a polishing slurry suitable for precision polishing in a process for producing a semiconductor device can be provided. Further, as the fine particles have a small particle size, there are such advantages that the firing temperature can be lowered and the firing time can be shortened in the production process. Further, the fine particles are effective also as a polishing material for glass such as an optical disk, a substrate for a magnetic disk, a substrate for display or an optical lens.

Further, the fine particles are suitably used also as an ultraviolet absorber for an ultraviolet-absorbing glass or an ultraviolet-absorbing film, a gas sensor or an electrode material for a solid oxide fuel cell.

BEST MODE FOR CARRYING OUT THE INVENTION

Figure 1:
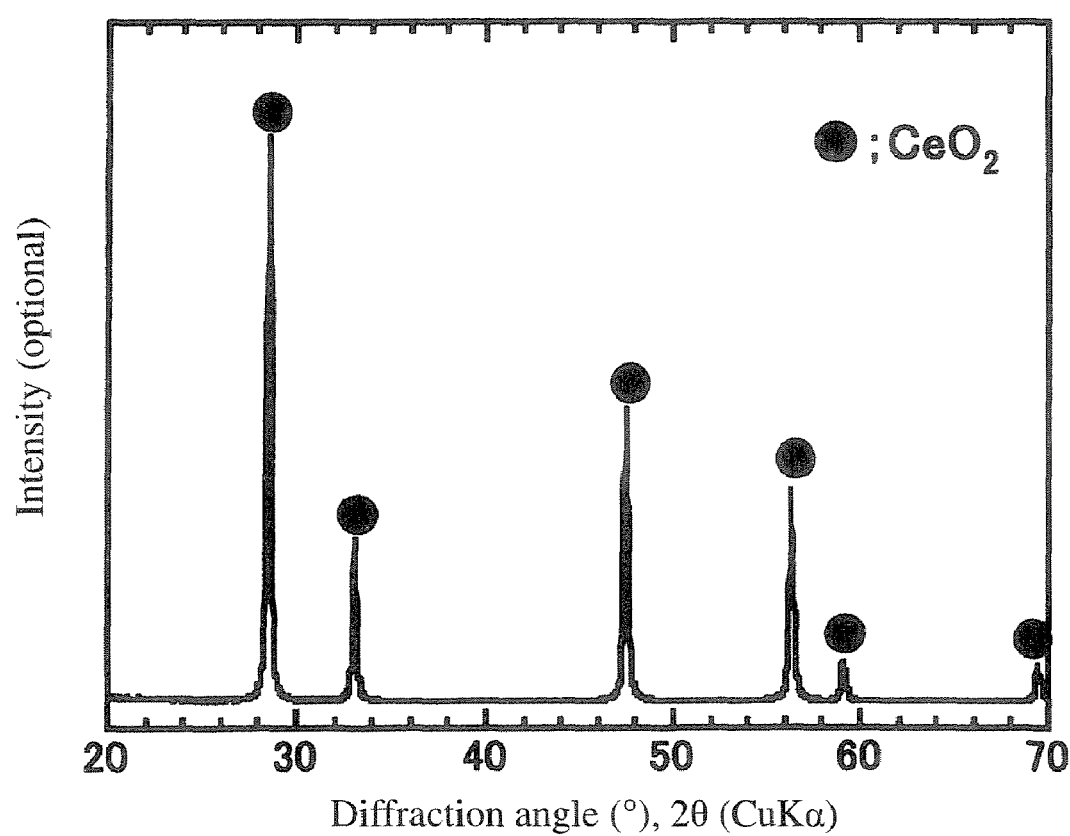
FIG. 1 illustrates an X-ray diffraction pattern of $CeO_2$ fine particles obtained in Example 5.

In the process for producing $CeO_2$ fine particles of the present invention, the melt is obtained by melting a mixture containing a $CeO_2$ source, an RO (wherein R is at least one member selected from the group consisting of Mg, Ca, Sr and Ba) source and a $B_2O_3$ source.

First, the $CeO_2$ source is preferably at least one member selected from the group consisting of cerium oxide ($CeO_2$, $Ce_2O3$) and cerium carbonate ($Ce_2(CO_3)_3 \cdot yH_2O$). Otherwise, at least one member selected from the group consisting of cerium chloride ($CeCl_3 \cdot yH_2O$), cerium nitrate (Ce($NO_3$)$_3 \cdot yH_2O$), cerium sulfate ($Ce_2(SO_4)_3 \cdot yH_2O$), cerium(IV) diammonium nitrate ($Ce(NH_4)_2(NO_3)_6$) and cerium fluoride ($CeF_3$) may be used (in the above formulae, y represents the hydration number, including the case of y=0). The $CeO_2$ source functions as a glass-forming component in collaboration with the after-mentioned RO source and $B_2O_3$ source by melting.

As the RO source, it is preferred to use at least one member selected from the group consisting of an oxide (RO) and a carbonate ($RCO_3$) of R. Further, at least one member selected from the group consisting of a nitrate of R (R($NO_3$)$_2$), a sulfate of R ($RSO_4$) and a fluoride of R ($RF_2$) may be used. In view of the solid solubility with $CeO_2$, R is preferably Ba or Sr.

Further, as the $B_2O_3$ source, boron oxide ($B_2O_3$) or boric acid ($H_3BO_3$) is preferably used, but a borate of an alkaline earth metal may also be used.

The purity of materials in the mixture is not particularly limited within a range not to degrade desired properties, but the purity excluding the water of hydration is preferably at least 99%, more preferably at least 99.9%. Further, the particle size of the above materials is not particularly limited within a range where a uniform melt is obtained by melting. Further, the materials are preferably dryly or wetly mixed by means of a mixing/grinding means such as a ball mill or a planetary mill and then melted.

Melting may be carried out in the air atmosphere but is preferably carried out while controlling the oxygen partial pressure and the oxygen flow rate. Further, a crucible used for melting is preferably made of alumina, platinum or platinum containing rhodium, but may be made of a refractory material in some cases. The melting is carried out preferably by using a resistant heating furnace, a high frequency induction furnace or a plasma-arc furnace. The resistance heating furnace is preferably an electric furnace provided with a heating element made of a metal such as a nichrome alloy, or made of silicon carbide or molybdenum silicide. The high frequency induction furnace is one provided with an induction coil and capable of controlling the output. Further, the plasma-arc furnace is one employing carbon or the like as an electrode, and utilizing the plasma-arc generated by the electrode. Further, the mixture may be melted by directly heating by infrared rays or laser. Melting is carried out preferably at 1,200° C. or above, particularly preferably from 1,300 to 1,500° C., and the obtained melt may be stirred to increase uniformity.

The mixture obtained by mixing the materials may be melted in a powder state, or it may be molded and then melted. In the case of using a plasma-arc furnace, it is possible to mold the mixture, melt the molded mixture as it is and then quench the melt.

The melt contains, as represented by mol % based on oxides, from 5 to 50% of $CeO_2$, from 10 to 50% of RO and from 30 to 75% of $B_2O_3$. A melt in the above range of composition is preferred, since it has an appropriate viscosity and further, an amorphous material will be obtained without crystallization of the melt by the subsequent quenching operation. This composition corresponds to the chemical composition of the materials before melting. In a case where the melt having a desired composition cannot be obtained e.g. by volatilization of materials during melting, the proportion of addition of the materials should be adjusted.

If the $CeO_2$ content exceeds 50%, the RO content is less than 10% and the $B_2O_3$ content is less than 30%, the melt is likely to be crystallized by quenching, and it is hardly be an amorphous material by vitrification, whereby $CeO_2$ fine particles having aimed properties are hardly obtained. On the other hand, if the $CeO_2$ content is less than 5%, and the RO content exceeds 50% or the $B_2O_3$ content exceeds 75%, $CeO_2$ crystals may not sufficiently be precipitated in the subsequent crystallization. Particularly preferred is a melt containing from 20 to 40% of $CeO_2$, from 10 to 40% of RO and from 40 to 60% of $B_2O_3$, with which $CeO_2$ fine particles having aimed properties are likely to be obtained, and their yield will be high.

Further, the above melt is preferably a melt containing the above $CeO_2$, the above RO and the above $B_2O_3$ in a molar ratio of $CeO_2$: $(RO+B_2O_3)$=5:95 to 50:50, particularly preferably from 20:80 to 35:65, whereby the melt is likely to be vitrified and the $CeO_2$ fine particles will easily be obtained.

Further, preferred is a melt containing the above RO and the above $B_2O_3$ in a molar ratio of $RO:B_2O_3$=20:80 to 50:50, particularly preferably 20:80 to 40:60, whereby the melt will easily be vitrified.

Then, as a step of quenching the obtained melt to make it an amorphous material, a method of casting the melt between twin rollers rotating at a high speed to obtain a flaky amorphous material, or a method of continuously winding a fibrous amorphous material (continuous fibers) from the melt by using a drum rotating at a high speed is suitably employed. At the time of quenching, the temperature-lowering rate is at least 100° C./sec for example, preferably at least $1\times10^{4}$° C./sec. The twin rollers and the drum are ones made of a metal or a ceramic. Further, a fibrous amorphous material (short fibers) may be obtained by using a spinner having pores provided on its side wall, rotating at a high speed. By using such an apparatus, the melt can be quenched effectively to obtain a high purity amorphous material.

In the case of a flaky amorphous material, it is preferred to quench the melt so that the thickness of the flakes is at most 200 μm, more preferably at most 100 μm. Further, in the case of a fibrous amorphous material, it is preferred to quench the melt so that the diameter of the fiber is at most 50 μm, more preferably at most 30 μm. It is preferred to quench the melt so that an amorphous material having a thickness or diameter of the above range or smaller is formed, whereby the crystallization efficiency in the subsequent crystallization step will be high. In a case where an amorphous material having a thickness or a diameter of the above range or larger is obtained, the amorphous material is preferably pulverized and then subjected to the crystallization step.

Then, $CeO_2$ crystals are precipitated from the amorphous material. The step of precipitating $CeO_2$ crystals from the amorphous material is carried out preferably in the air at from 600 to 900° C. Crystals are hardly precipitated even when the amorphous material is heated at less than 600° C. continuously for about 24 hours, and if the temperature exceeds 900° C., the crystallized product containing the amorphous material may be melted. More preferably, the step is carried out at from 650 to 850° C. This crystal precipitation step comprises two stages of nucleus formation and subsequent crystal growth, and these two stages may be carried out at different temperatures. The higher the temperature, the larger the particle size of the crystals precipitated tends to be. Thus, the crystallization temperature is set depending upon the desired particle size. In the present invention, mainly $CeO_2$ are precipitated as crystals by the crystallization of the amorphous material. Depending upon the composition of the mixture, a borate of R or $CeO_2$, or a double salt of RO and boric acid may be precipitated in some cases. In such a case, they can be removed all at once by the subsequent leaching treatment.

Further, for the crystallization, the amorphous material is preferably maintained within the above temperature for from 4 to 96 hours, particularly preferably from 8 to 32 hours, whereby $CeO_2$ can be sufficiently crystallized. On that occasion, the longer the holding time, the larger the particle size of crystals precipitated tends to be and accordingly the holding time is set depending upon the desired particle size.

Then, $CeO_2$ crystals are separated from the crystallized product containing the $CeO_2$ crystals obtained by the above procedure. Substances other than the $CeO_2$ crystals can easily be leached and removed from the crystallized product by using an acid. As the acid, an inorganic acid such as acetic acid, hydrochloric acid or nitric acid, or an organic acid such as oxalic acid or citric acid may be used. In order to accelerate the reaction, the acid may be heated, or ultrasonic application may be employed in combination. Some of the $CeO_2$ crystals are dissolved by the leaching treatment in some cases, which is rather preferred with a view to obtaining a uniform particle size.

After the leaching treatment, washing with pure water is carried out as the case requires, to obtain $CeO_2$ fine particles. The average primary particle size (the major axis in the case of anisotropic particles) of the obtained fine particles is preferably from 5 to 200 nm. The smaller the average primary particle size of the obtained fine particles, the more precise the polishing will be, and the more occurrence of e.g. scratches will be suppressed. The average primary particle size is more preferably from 5 to 100 nm, particularly preferably from 10 to 50 nm.

Then, the above-obtained $CeO_2$ fine particles are dispersed in a proper liquid medium to prepare a polishing slurry.

The liquid medium is not particularly limited, and preferred is water or an aqueous medium containing water as the main component, with a view to maintaining a proper viscosity i.e. fluidity of the slurry. In a case where no desired viscosity is obtained, a viscosity-controlling agent may be incorporated in the slurry. Further, a solvent having a high relative dielectric constant such as methanol, ethanol, propanol, ethylene glycol or propylene glycol may be incorporated for the purpose of increasing the polishing properties or the dispersion stability.

The content of the $CeO_2$ fine particles in the polishing slurry is set considering the removal rate, the uniform dispersibility, stability at the time of dispersing, etc., and in the present invention, from 0.1 to 20 mass % of the $CeO_2$ fine particles are contained in the total mass of the polishing slurry. If the content is less than 0.1 mass %, the removal rate will be insufficient, and if it exceeds 20 mass %, the viscosity of the slurry tends to be high, and handling of the polishing slurry will be difficult. The content is more preferably from 0.5 to 5 mass %.

The above $CeO_2$ fine particles may be used for the slurry as they are, but they are preferably pulverized in a powder state, more preferably water or an aqueous medium is added to the fine particles to prepare a suspension, which is wet pulverized, and then the slurry is prepared. For example, the above pulverization and dispersion are carried out by using a dry jet mill, a ball (bead) mill or a planetary mill in which powder particles collide with one another at high speed, or a high pressure homogenizer in which a plurality of fluids colloid with one another, or an ultrasonic application apparatus. Further, filtration treatment by a filter or centrifugal separation may be carried out to remove agglomerated particles or coarse particles. The size of particles dispersed in the polishing slurry is preferably from 10 to 300 nm, in view of excellent removal rate. The size of the dispersed particles is particularly preferably from 20 to 200 nm.

Further, a dispersing agent, a pH adjustor, a pH buffering agent, an oxidizing agent, a resin to be a stabilizer for fine particles, an agent for preventing dishing and erosion, etc., may be incorporated in the slurry depending upon the purpose of use, within a range not to impair excellent polishing properties of the polishing slurry of the present invention. The dispersing agent may, for example, be an ammonium polycarboxylate or an ammonium polyacrylate. The pH adjustor and the pH buffering agent may, for example, be an inorganic acid such as nitric acid, a carboxylic acid such as succinic acid or citric acid, ammonium water, a quaternary ammonium hydroxide such as tetramethylammonium hydroxide or an alkali metal hydroxide. The pH of the slurry is controlled to be preferably from 2 to 10, particularly preferably from 4 to 9.

EXAMPLES

Now, the present invention will be described in detail with reference to Examples. However, it should be understood that the present invention is by no means restricted to such specific Examples.

(1) Preparation of $CeO_2$ Fine Particles

Examples 1 to 17

Cerium oxide ($CeO_2$), $RCO_3$ (R=Ba and/or Sr) and boron oxide ($B_2O_3$) were weighed in the proportion shown in Table 1 as represented by mol % based on $CeO_2$, RO and $B_2O_3$, respectively, a small amount of ethanol was added, and they were mixed and pulverized in an automatic mortar. Then, the mixture was dried to obtain a material powder.

The obtained material powder was put in a crucible with a nozzle, made of platinum containing 10 mass % of rhodium, and heated in an electric furnace employing molybdenum silicide as a heating element at 1,500° C. for one hour so that the material powder was completely melted.

Then, the melt was cast while the bottom of the is nozzle was heated in the electric furnace, and made to pass through twin rollers having a diameter of about 15 cm, rotating at 300 rpm to quench the droplets at a level of $1\times10^{5}$° C./sec to obtain a flaky solid. The obtained flakes were a brownish-red transparent amorphous material. The thickness of the flakes was measured by a micrometer and was from 30 to 50 μm.

Using some of the obtained flakes, the crystallization starting temperature was preliminary determined by differential scanning calorimetery (DSC), and the flakes were heated for 8 hours at a temperature shown in Table 1, which was higher than the crystallization starting temperature, to precipitate plate-like $CeO_2$ crystals.

Then, the flakes after the crystallization temperature were left to stand in a 1 mol/L acetic acid solution at 70° C. for 20 hours to leach soluble materials. The liquid after leaching was subjected to centrifugal separation, the supernatant was discarded, and the residue was washed with water and further dispersed under high pressure, dried, further washed with water, and dried to obtain fine particles having a particle size of from 5 to 100 nm.

The mineral phase of the obtained $CeO_2$ fine particles was identified by an X-ray diffractometer. As a result, the fine particles were cubic crystals, the obtained peak agreed with a known diffraction peak of $CeO_2$, and the obtained fine particles were found to be particles with high crystallinity consisting of a $CeO_2$ single phase. The X-ray diffraction pattern of the fine particles obtained in Example 5 is shown in FIG. 1.

Then, the average primary particle size was obtained. The average primary particle size is the crystallite diameter, and is a particle size calculated based on the Scherrer formula from the X-ray diffraction line broadening. The results are shown in Table 1. As is evident from Table 1, the obtained fine particles have a very small particle size in each Example.

TABLE 1

| | Chemical composition (mol %) | | | Crystallization temperature | Crystallite diameter |
|---|---|---|---|---|---|
| | $CeO_2$ | RO | $B_2O_3$ | (° C.) | (nm) |
| Ex. 1 | 10.0 | 30.0 BaO | 60.0 | 800 | 70 |
| Ex. 2 | 10.0 | 45.0 SrO | 45.0 | 700 | 16 |
| Ex. 3 | 20.0 | 40.0 SrO | 40.0 | 700 | 14 |
| Ex. 4 | 20.0 | 26.7 BaO | 53.3 | 800 | 73 |
| Ex. 5 | 25.0 | 25.0 BaO | 50.0 | 750 | 42 |
| Ex. 6 | 25.0 | 12.5 SrO + 12.5 BaO | 50.0 | 800 | 72 |
| Ex. 7 | 25.0 | 25.0 SrO | 50.0 | 800 | 62 |
| Ex. 8 | 33.3 | 22.2 BaO | 44.4 | 750 | 41 |
| Ex. 9 | 20.0 | 16.0 BaO | 64.0 | 800 | 65 |
| Ex. 10 | 25.0 | 15.0 BaO | 60.0 | 850 | 85 |
| Ex. 11 | 33.3 | 13.3 BaO | 53.3 | 850 | 89 |
| Ex. 12 | 33.3 | 6.7 SrO + 6.7 BaO | 53.3 | 850 | 73 |
| Ex. 13 | 33.3 | 13.3 SrO | 53.3 | 850 | 99 |
| Ex. 14 | 40.0 | 20.0 SrO | 40.0 | 800 | 55 |
| Ex. 15 | 40.0 | 12.0 SrO | 48.0 | 800 | 48 |
| Ex. 16 | 40.0 | 10.0 SrO + 10.0 BaO | 40.0 | 800 | 60 |
| Ex. 17 | 40.0 | 6.0 SrO + 6.0 BaO | 48.0 | 800 | 52 |

Examples 18 to 24

$CeO_2$ fine particles were obtained in the same manner as in Example 1 except that the chemical composition of the material mixture was changed to the proportion shown in Table 2 and that the flakes were heated at the crystallization temperature shown in Table 2 for 8 hours. The mineral phase of the obtained $CeO_2$ fine particles was identified in the same manner as in Example 1 and as a result, the fine particles were particles with high crystallinity consisting of a $CeO_2$ single phase. Further, the crystallite diameter of the obtained fine particles was measured in the same manner as in Example 1 and as a result, the obtained fine particles had a very small particle size in each Example as is evident from Table 2. Further, an increase of the crystallite diameter along with the increase of the crystallization temperature was confirmed.

TABLE 2

| | Chemical composition | Crystallization temperature (° C.) | Crystallite diameter (nm) |
|---|---|---|---|
| Ex.18 | Same as Ex.5 | 670 | 15 |
| Ex.19 | Same as Ex.5 | 700 | 24 |
| Ex.20 | Same as Ex.5 | 720 | 30 |
| Ex.21 | Same as Ex.5 | 800 | 58 |
| Ex.22 | Same as Ex.11 | 710 | 46 |
| Ex.23 | Same as Ex.11 | 770 | 60 |
| Ex.24 | Same as Ex.13 | 720 | 46 |

Examples 25 (Comparative Example)

The melt obtained by carrying out the mixing and pulverization operation and the melting operation in the same manner as in Example 5, was cooled in the electronic furnace to room temperature at a rate of 300° C./h, whereupon an opaque solid was formed and no amorphous material was obtained.

Examples 26 and 27 (Comparative Examples)

Cerium oxide ($CeO_2$), barium carbonate ($BaCO_3$) and boron oxide ($B_2O_3$) were weighed in the proportion shown in Table 3 represented by mol % based on $CeO_2$, BaO and $B_2O_3$, respectively, and the mixing and pulverization operation and the melting operation were carried out in the same manner as in Example 5, whereupon an opaque solid was formed and no amorphous material was obtained.

Examples 28 and 29 (Comparative Examples)

Cerium oxide ($CeO_2$), barium carbonate ($BaCO_3$) and boron oxide ($B_2O_3$) were weighed in the proportion shown in Table 3 represented by mol % based on $CeO_2$, BaO and $B_2O_3$, respectively, and the mixing and pulverization operation, the melting operation and the quenching operation were carried out in the same manner as in Example 1, whereupon transparent flakes were obtained. The crystallization operation and the leaching operation were carried out in the same manner as in Example 1, but substantially no crystalline $CeO_2$ fine particles were obtained.

TABLE 3

| | Chemical composition (mol %) | | |
|---|---|---|---|
| | $CeO_2$ | BaO | $B_2O_3$ |
| Ex.26 | 60.0 | 10.0 | 30.0 |
| Ex.27 | 60.0 | 20.0 | 20.0 |
| Ex.28 | 3.0 | 32.3 | 64.7 |
| Ex.29 | 5.0 | 10.0 | 85.0 |

(2) Preparation of Slurry 100 g of the $CeO_2$ fine particles obtained in the above Example 19 was added to about 800 mL of distilled water, and 0.1 mol/L nitric acid was gradually added thereto with stirring to adjust a pH 4.0, and distilled water was further added so that the total volume was 1 L, to prepare a slurry liquid A containing 10 mass % of $CeO_2$. Further, 100 g of the $CeO_2$ fine particles obtained in the above Example 24 was added to about 800 mL of distilled water, and 0.1 mol/L nitric acid was gradually added thereto with stirring to adjust a pH 4.0, and distilled water was further added thereto so that the total volume was 1 L, to prepare a slurry liquid B containing 10 mass % of $CeO_2$. Further, commercially available $CeO_2$ fine particles (tradename: NanoTek, manufactured by C.I. Kasei Company, Limited, average primary particle size: 14 nm) were added to distilled water to prepare a 10 mass % slurry liquid C.

A pH adjustor and a dispersing agent were added to each of the slurry liquids A to C as shown in Table 4, followed by wet pulverization by a wet jet mill, and coarse particles were removed by centrifugal separation to prepare polishing slurries in Examples 30 to 35. The pH adjustor D was 0.1 mol/L nitric acid, and the pH adjustor E was 0.5 mol/L ammonia water. The dispersing agent was ammonium polyacrylate. Further, the diameter of the particles dispersed in the slurry was measured by a laser scattering particle size distribution meter and as a result, a good dispersion was obtained in each of Examples 30 to 35 as is evident from Table 4.

TABLE 4

| | Slurry liquid | $CeO_2$ content in the total mass of polishing slurry (mass %) | Dispersing agent (mass %) | pH adjustor | Slurry pH | Size of dispersed particles (nm) |
|---|---|---|---|---|---|---|
| Ex. 30 | A | 1.0 | 0.1 | D | 4.0 | 120 |
| Ex. 31 | A | 1.0 | — | D | 4.0 | 160 |
| Ex. 32 | A | 1.0 | 0.1 | E | 8.5 | 120 |
| Ex. 33 | A | 3.0 | 0.1 | D | 4.0 | 150 |
| Ex. 34 | B | 1.0 | 0.1 | D | 4.0 | 140 |
| Ex. 35 (Comp. Ex.) | C | 1.0 | 0.1 | D | 4.0 | 120 |

(3) Polishing Conditions

Polishing was carried out by using the following apparatus under the following conditions.

Polishing machine: automatic CMP apparatus MIRRA (Tradename: Compass, manufactured by Applied Materials, Inc.)

Polishing pressure: 20 kPa

Number of revolutions: platen: 105 rpm

Head (base-holding portion): 98 rpm

Polishing slurry supply rate: 200 mL/min

Polishing pad: IC1000 (manufactured by Rodel Inc.)

(4) Object to be Polished

As an object to be polished, the following (a) and (b) were used (each manufactured by SEMATECH Inc.).

(a) A wafer for evaluation of $SiO_2$ (insulating layer) removal rate: an 8 inch wafer comprising a $SiO_2$ layer with a thickness of 800 nm deposited by plasma CVD on a Si substrate.

(b) A wafer for evaluation of $SiN_x$ (stopper layer) removal rate: an 8 inch wafer comprising $SiN_x$ with a thickness of 100 nm deposited by thermal CVD on a Si substrate.

(5) Method for Evaluating Polishing Properties

The removal rate was calculated by the thicknesses before and after the polishing. For measurement of the thickness, an optical interference type automatic thickness-measuring apparatus UV1280SE (manufactured by KLA-Tencor Corporation) was used. To evaluate the is removal rates of the insulating layers and the stopper layers, the above (a) and (b) were used, and for this evaluation, the polishing slurries having compositions in Examples 30 to 35 were used.

Further, using the polishing slurries having compositions in Examples 30 to 35, the above wafer (a) was polished under the above conditions for 60 seconds and then washed and dried, and the number of scratches on the wafer caused by the polishing was measured by using a scratch detecting apparatus 2132 (manufactured by KLA-Tencor Corporation).

The removal rates (nm/min) of the $SiO_2$ and $SiN_x$ films and the number of scratches, obtained by using (a) and (b), are shown in Table 5. As is evident from these results, the polishing slurry according to the present invention provides a high $SiO_2$ removal rate and a relatively low $SiN_x$ removal rate, and provides a small number of scratches on the $SiO_2$ wafer. It is understood that utilizing such properties, a polishing slurry suitable to realize CMP polishing with high accuracy will be obtained in a STI process of polishing a $SiO_2$ layer at a high removal rate, which requires termination of polishing upon exposure of the $SiN_x$ layer.

TABLE 5

|  | Removal rate | | Number of |
| --- | --- | --- | --- |
|  | (a) | (b) | scratches |
| Ex.30 | 240 | 8 | 700 |
| Ex.31 | 260 | 8 | 2,800 |
| Ex.32 | 230 | 7 | 600 |
| Ex.33 | 360 | 12 | 2,200 |
| Ex.34 | 340 | 8 | 900 |
| Ex.35 (Comp.Ex.) | 60 | 10 | 4,300 |

INDUSTRIAL APPLICABILITY

The $CeO_2$ fine particles obtained by the present invention have high crystallinity, are excellent in uniformity of composition and particle size, and have a small particle size, and accordingly by using such fine particles, a polishing slurry suitable for precision polishing in a process for producing a semiconductor device can be provided. Further, such fine particles are effective also as a polishing material for glass, an ultraviolet absorber for an ultraviolet-absorbing glass or an ultraviolet-absorbing film, a gas sensor or an electrode material for a solid oxide fuel cell.

The entire disclosure of Japanese Patent Application No. 2004-323854 filed on Nov. 8, 2004 including specification, claims, drawings and summary is incorporated herein by reference in its entirety.

What is claimed is:

1. A process for producing $CeO_2$ fine particles, which comprises a step of obtaining a melt containing, as represented by mol % based on oxides, from 5 to 50% of $CeO_2$, from 10 to 50% of RO (wherein R is at least one member selected from the group consisting of Mg, Ca, Sr and Ba) and from 30 to 75% of $B_2O_3$, a step of quenching the melt to obtain an amorphous material, a step of precipitating $CeO_2$ crystals from the amorphous material, and a step of separating the $CeO_2$ crystals from the obtained crystallized product, in this order.

2. The process for producing $CeO_2$ fine particles according to claim 1, wherein in the melt, the above $CeO_2$, the above RO and the above $B_2O_3$ are contained in a molar ratio of $CeO_2$: $(RO+B_2O_3)$=5:95 to 50:50.

3. The process for producing $CeO_2$ fine particles according to claim 1, wherein in the melt, the above RO and the above $B_2O_3$ are contained in a molar ratio of RO:$B_2O_3$=20:80 to 50:50.

4. The process for producing $CeO_2$ fine particles according to claim 1, wherein the melt is quenched to obtain a flaky or fibrous amorphous material.

5. The process for producing $CeO_2$ fine particles according to claim 1, wherein the step of precipitating the $CeO_2$ crystals from the amorphous material is carried out at a temperature of from 600 to 900° C.

6. The process for producing $CeO_2$ fine particles according to claim 1, wherein the step of separating the $CeO_2$ crystals is carried out by using an acid.

7. The process for producing $CeO_2$ fine particles according to claim 1, wherein the average primary particle size of the $CeO_2$ fine particles is from 5 to 200 nm.

8. A polishing slurry containing the $CeO_2$ fine particles obtained by the process as defined in claim 1 dispersed in a liquid medium, with a content of from 0.1 to 20 mass % based on the slurry total mass.

9. The polishing slurry according to claim 8, wherein the size of the dispersed particles is from 10 to 300 nm.

* * * * *